United States Patent
Roberts et al.

[11] Patent Number: 5,883,578
[45] Date of Patent: Mar. 16, 1999

[54] LOSS OF POTENTIAL DETERMINATION FOR USE IN PROTECTIVE RELAYS FOR ELECTRIC POWER SYSTEMS

[75] Inventors: Jeffrey B. Roberts, Moscow, Id.; Daging Hou, Pullman, Wash.

[73] Assignee: Schweitzer Engineering Laboratories, Inc., Pullman, Wash.

[21] Appl. No.: 687,836

[22] Filed: Jul. 26, 1996

[51] Int. Cl.$^6$ .................................................. G08B 21/00
[52] U.S. Cl. ........................ 340/661; 307/125; 361/58; 361/59; 361/76; 361/79; 361/85
[58] Field of Search ........................ 340/661; 364/494, 364/495; 361/64, 76, 79, 85, 86, 59, 58; 307/125

[56] References Cited

U.S. PATENT DOCUMENTS

| | | |
|---|---|---|
| 3,743,889 | 7/1973 | Lopez-Batiz .............................. 361/85 |
| 3,875,463 | 4/1975 | Reuter et al. ............................. 361/85 |
| 3,947,728 | 3/1976 | Smith ....................................... 361/59 |
| 4,091,433 | 5/1978 | Wilkinson ................................ 361/79 |
| 4,210,948 | 7/1980 | Waltz ....................................... 361/76 |
| 4,366,474 | 12/1982 | Loewenstein .......................... 340/661 |
| 4,795,983 | 1/1989 | Crockett et al. ......................... 361/76 |
| 5,041,737 | 8/1991 | Schweitzer, III et al. ............. 307/125 |
| 5,300,924 | 4/1994 | McEachern et al. .................. 340/661 |
| 5,642,249 | 6/1997 | Kuznetsov ............................... 361/58 |

*Primary Examiner*—Jeffery A. Hofsass
*Assistant Examiner*—John Tweel, Jr.
*Attorney, Agent, or Firm*—Jensen & Puntigam, P.S.

[57] ABSTRACT

The positive sequence voltage on the power line is measured at a given time, i.e. the present time, and also for one cycle earlier, and the ratio thereof is then compared against a threshold value of 0.9. There are four other supervisory tests which also must be true for a loss of potential condition to be indicated. These include determination of change in positive sequence current and angle and zero sequence current and angle. If the change in those values is smaller than selected thresholds, then a loss of potential condition is indicated.

13 Claims, 2 Drawing Sheets

5,883,578

LOSS OF POTENTIAL DETERMINATION FOR USE IN PROTECTIVE RELAYS FOR ELECTRIC POWER SYSTEMS

TECHNICAL FIELD

This invention relates generally to protective relays used for protection of electric power systems, and more particularly concerns an improved loss of potential circuit for use in such protective relays.

BACKGROUND OF THE INVENTION

In many power system protective relays, including microprocessor-based digital relays, the three phase AC voltages on the particular power line associated with the relay are measured and then applied, after being significantly reduced in magnitude by voltage transformers, to various protective elements in the relay, including distance elements and directional elements, among others, which use the reduced AC voltages to determine the presence (or lack thereof) of a fault on the power line. In addition, these AC power line voltages (phases A, B and C), sometimes referred to as potentials, are also used to produce the polarizing signals for various logic and other control circuits in the protective relay. Hence, the three phase AC power line voltages or potentials are critical input signals for proper operation of the relay and their accuracy is thus quite important.

When one or more of these AC voltages (A, B or C phase) are eliminated due to loss in the system of a voltage transformer, a protective fuse or similar protective device such as a molded case circuit breaker which protects all three phases, false outputs from the protective elements or other logic circuits can result. These false outputs can ultimately produce either a false trip signal which will cause a circuit breaker on the line to open, or in other cases there will be a failure to trip the line circuit breaker when there is in fact a fault on the line. Either of these results is quite undesirable.

For instance, in the case of a directional element in the relay which uses the calculated negative sequence voltage of the power line for the task of supervising distance elements and ground overcurrent elements, the correct calculation of the negative sequence voltage requires all three of the phase voltages (phases A, B and C). The advantage of using negative sequence voltage is that the resulting directional signal, specifically, the indication of a forward or reverse fault relative to the position of the protective relay, is independent of the magnitude of the load current or the direction thereof.

However, when a protective fuse for a particular phase line blows or similar local protective device operates, the resulting loss of the associated AC voltage on that phase line will result in an erroneous negative sequence voltage value, which in turn may result in the directional element giving a false fault direction.

Hence, it is important that the relay be able to determine a loss of potential, such as due to a blown fuse, declare accordingly a loss of potential condition and block use of any resulting output determination from elements or circuits such as described above.

In the case of blown fuse(s), the number of fuses that blow (one, two or three, for the three phases) at the secondary winding of the voltage transformer depends upon the nature of the short circuit or other condition on the load side (downstream side) of the fuse. In the situation where a molded case circuit breaker is used, all three potentials (phases A, B and C) are eliminated from the relay input information at once, regardless of the type of short circuit at the load. The loss-of-potential determination circuit in that particular case is designed to detect the loss of any of the phase voltage(s). The loss of a phase voltage or voltages in effect blocks the operation of those parts of the relay using phase potentials (voltages) directly or calculated results from equations which assume all three potentials to be present.

Most digital relays include loss of potential (LOP) logic which is capable of detecting whether one or two fuses are blown. In some cases, the LOP logic can also determine whether fuses are blown. Such LOP determinations are more sophisticated than merely determining whether all three potentials are missing, such as described above. A relatively recent LOP circuit which has been effective in most circumstances is shown in U.S. Pat. No. 5,262,679, which is assigned to the same assignee as the present invention.

Even with the more sophisticated LOP detection circuits, such as described in the '679 patent, however, there are particular system conditions which are not well covered. One such condition involves a power line condition of a heavy load and relatively weak voltage sources, i.e. a weak positive sequence source impedance behind the protective relay. In such a case, the necessary positive sequence voltage threshold value for the LOP circuit cannot be achieved. The LOP logic in that situation must be disabled, which is disadvantageous.

Another condition involves the completion of LOP calculations (and LOP pickup) prior to an instantaneous trip signal being produced by a protective element in the relay, when a true LOP condition exists. For instance, under certain conditions, such as where the line is heavily loaded and the magnitude of the load current is large, the distance elements in the relay will normally pickup very rapidly, creating in effect a "race" between the LOP logic which will ultimately block the output of the distance elements, and the distance elements themselves actually operating first and producing a trip of the line circuit breaker. While there are techniques which can be used to minimize this risk of a race and the instantaneous protective elements operating in extreme load conditions, even such techniques are not adequate. The only solution in such cases, which is undesirable, is to add time-delay to the instantaneous protective elements.

Accordingly, it would be desirable for an LOP circuit to be less susceptible to various system conditions and more reliable under all operating conditions.

DISCLOSURE OF THE INVENTION

Accordingly, the present invention is an apparatus in a protective relay used in protecting power systems for determining loss of potential on a power line, comprising: means for determining present positive sequence voltage on the power and for a selected earlier point in time, comparing the ratio thereof against a first preselected value and providing a first signal indication therefrom; and means for determining present positive sequence current on the power line and for said selected earlier time, comparing any difference therebetween against a second preselected value and providing a second signal indication therefrom.

BEST MODE FOR CARRYING OUT THE INVENTION

The basic operation of the preferred embodiment of the present invention is based upon a determination of a change in magnitude of calculated positive sequence voltage of the power line being protected, while at the same time there is not a significant change in magnitude or angle of either the positive sequence current or zero sequence current.

Figure 1:
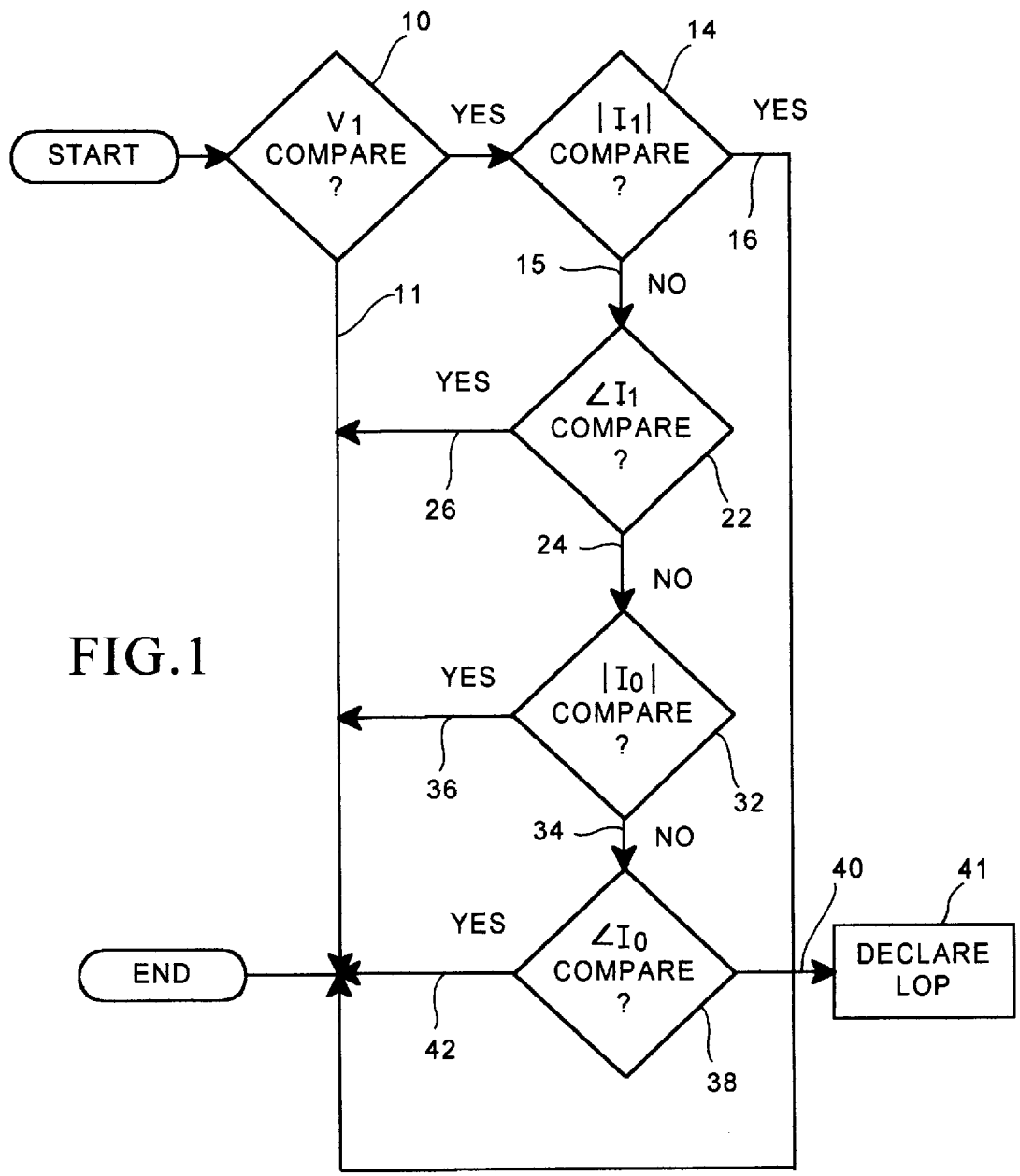
FIG. 1 is a simplified operational block diagram of the embodiment of the present invention described herein.

FIG. 1 shows in general the basic operational sequence of the preferred embodiment. Initially, as shown in block 10, the magnitude of the positive sequence voltage, generally referred to as $V_1$, is compared with the magnitude of $V_1$ from one cycle earlier on the power signal. For purposes of this application, the present positive sequence voltage is referred to as $V_{1K}$, while the one-cycle-earlier positive sequence voltage is referred to as $V_{1K-1}$. In the embodiment shown, if $V_{1K}$ is less than or equal to $0.9\ V_{1K-1}$, then an LOP condition is possible at that particular time, while if that is not true, the routine is terminated, by a signal or line 11.

Next, the absolute value of the magnitude of the positive sequence current (generally referred to as $I_1$) is measured and compared with the magnitude of the positive sequence current of one cycle earlier in the power signal, as shown at block 14. In the embodiment shown, the present positive sequence current is referred to as $I_{1K}$, while the positive sequence current of one cycle earlier is $I_{1K-1}$. In the embodiment shown, if $|I_{1K}$ minus $I_{1K-1}|$ is less than or equal to 0.1, which in essence means that $I_1$, is not changing, then an LOP condition is still possible and a signal occurs on line 15. If not, the routine is terminated by a signal on line 16. 16.

In the next comparison, as shown by block 22, the angle of the positive sequence current, generally referred to as $\angle I_1$, is measured and compared to the current angle of one cycle earlier. In the embodiment shown, the present positive sequence current angle is referred to as $\angle I_{1K}$, while the current angle from one cycle earlier is referred to as $\angle I_{1K-1}$. If $|I_{1K}$ minus $\angle I_{1K-1}|$ is less than or equal to 5° (indicating that a significant threshold of 5° change is not occurring), when the previous LOP conditions of blocks and 14 have been met, then an LOP condition remains possible. A signal is accordingly applied on line 24 to the next comparison. If the result of the comparison exceeds the threshold, then a signal is applied on line 26 to terminate the routine.

In the next comparison, shown at block 32 in the embodiment shown, the zero sequence current, generally referred to as $I_0$, on the power line is compared to the zero sequence current from one cycle earlier. In the embodiment shown, the present zero sequence current is referred to as $I_{0K}$, while the zero sequence current from one cycle earlier is referred to as $I_{0K-1}$. In the comparison, if $|I_{0K}$ minus $I_{0K-1}|$ is less than or equal to 0.1, indicating only a small change at most in the magnitude of the current, a signal is applied on line 34 to initiate the next comparison. If the change in current magnitude exceeds the threshold, then a signal on line 36 will result in termination of the routine.

In the next (and last) comparison, shown at block 38, the angle of the zero sequence current (generally referred to as $\angle I_0$) is measured and then compared to the zero sequence current angle from one cycle earlier. In the embodiment shown, the present zero sequence current angle is referred to as $\angle I_{0K}$ and the current angle from one cycle earlier is called $\angle I_{0K-1}$. If $|\angle I_{0K}$ minus $\angle I_{0K-1}|$ is less than or equal to 5°, and the conditions of all previous blocks 10, 14, 22 and 32 are satisfied, there will be an output signal on line 40, which will result in a declaration of an LOP condition, as shown at block 41. This output signal may be transmitted to selected relay elements to prevent operation (pickup) thereof during the time of the LOP condition. If the angle difference determined by block 38 is greater than 5°, a signal is applied on line 42, terminating the routine, without a declaration of an LOP condition.

Figure 2:
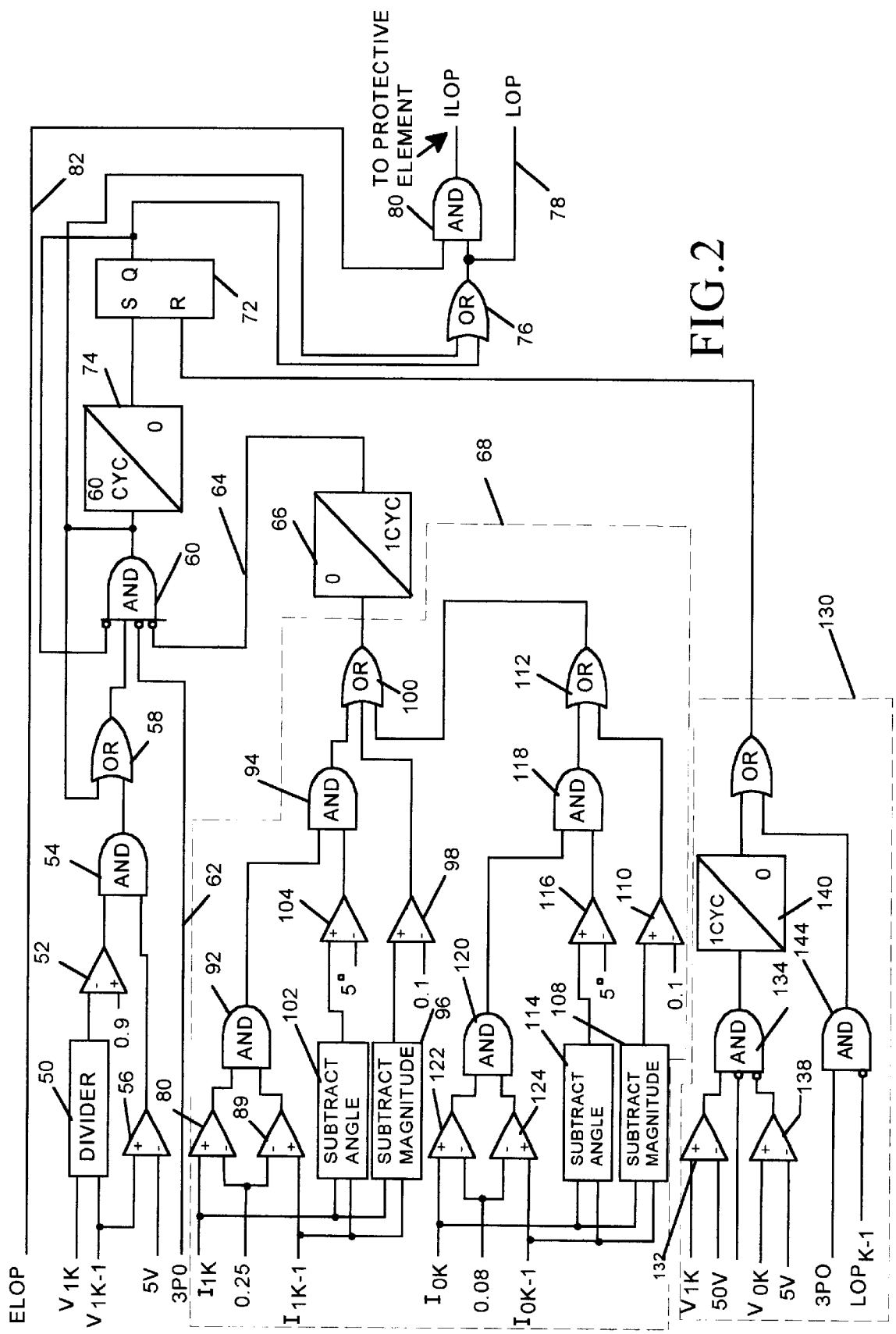
FIG. 2 is a logic diagram of the embodiment of FIG. 1.

FIG. 2 shows the actual logic circuit for carrying out the operation of the circuit of FIG. 1. As indicated above, the magnitude of the present positive sequence voltage ($V_{1K}$) is first measured and applied to a divider (ratio) circuit 50, along with the magnitude of the positive sequence voltage from one cycle earlier ($V_{1K-1}$). The ratio value from divider 50 is applied to a comparator 52 which compares the ratio value against a pre-established reference threshold of 0.9. If the ratio is lower than 0.9, then the output of comparator 52 is high, indicating that the positive sequence voltage is changing at a rate greater than the preestablished standard.

The establishment of a threshold of 0.9 is a tradeoff between speed and security in the LOP circuit. The LOP logic must, on the one hand, be fast enough to produce an LOP blocking signal before any protective elements which use measured voltages in their trip evaluation can operate, i.e. pickup, and produce a trip signal. The higher the threshold value, the faster that the LOP logic will assert. However, a high threshold will decrease security against false LOP declarations. Therefore, a 0.9 threshold appears to be a reasonable compromise. This threshold value could be varied, however.

The output of comparator 52 is applied to one input of AND gate 54. The other input to AND gate 54 is the output of a comparator 56, which compares the $V_{1K-1}$ value against a threshold of 5 volts. Satisfying this comparison indicates that the magnitude determination of the positive sequence voltage is likely to be accurate and reliable. The output of AND gate 54 is applied as one input to an OR gate 58, the output of which is applied as one input to a four input AND gate 60.

One of the other three inputs to AND gate 60 is a NOT input from line 62 relative to a three-pole open condition (3PO) indication. As long as there is not a three pole open condition on the power line being protected, the signal at the NOT input will be low. Another NOT input is from line 64 from a timer 66. While the operation of timer 66 will be discussed in more detail hereinafter, basically, it is responsive to the logic circuitry referred to generally at 68 which includes the four "supervisory" conditions involving positive sequence and zero sequence current magnitudes and angles discussed above relative to blocks 14, 22, 32 and 38 in FIG. 1.

The result of these four comparisons is applied to timer 66, which provides an input signal to AND gate 60 on line 64. If the signal from timer 66 is low, indicating that there has been no significant change in positive sequence and zero sequence currents and angles, the signal at the NOT input to AND gate 60 will be low. The remaining input to AND gate 60, which is also a NOT input, is from the output Q of set/reset flip-flop 72. Initially, flip-flop 72 is in its reset position and the output at the Q output is low, such that the signal at the NOT input to AND gate 60 is low.

Hence, as can be seen, a high output from OR gate 58, indicating a threshold-achieving change in magnitude of the positive sequence voltage, will typically result in a high output (at least initially) from AND gate 60. This output is applied to a time-delayed pickup-instantaneous dropout timer 74, and also directly back to OR gate 58 as well, which input acts to "seal in" the effect of the initial magnitude determination, and directly to OR gate 76.

The output of OR gate 76 is thus immediately high when the output of AND gate 60 goes high. The output of OR gate 76 is applied on line 78 as an LOP signal, which indicates that a loss of potential condition has been determined. The output of OR gate 76, in the embodiment shown, however, is not initially latched because if the output of AND gate 60 goes low, the output of OR gate 76 will also go low (until OR gate 76 is latched).

The output of OR gate 60, as indicated above, is applied to time-delay pickup/instantaneous-dropout timer 74. The time-delay pickup in the embodiment shown is for 60 cycles. Hence, after a high output of AND gate 60 is initially established, 60 cycles must pass before timer 74 produces an output, which is applied to flip-flop 72.

The output of flip-flop 72 at "Q" is high (logical one) when the "S" (set) input is asserted, i.e. when there is a high input from timer 74. The "Q" output is low when the "R" (reset) input is asserted. In the event of simultaneous assertions of both "S" and "R" inputs, the "R" input has priority and the "Q" output is low.

During the 60-cycle time of timer 74, it is possible that the 3PO input on line 62 to AND gate 60 can go high, indicating the presence of a three-pole open condition on the line. If this occurs, the output of AND gate 60 will go low (de-assert), as will the output of timer 74, due to its instantaneous dropout characteristic. However, if the 3PO input on line 62 remains low such that the NOT input to AND gate 60 remains high and the NOT input from timer 66 remains high, then after 60 cycles the "Q" output of flip-flop 72 will go high, which will also cause the output of AND gate 60 to go low. The "Q" output of flip-flop 72 will remain high, however, until it is reset, "latching" the high input to OR gate 76.

The output of OR gate 76 is also applied to AND gate 80, the other input of which is an ELOP (enable loss of potential) signal on line 82. The ELOP signal, in combination with the ILOP and LOP outputs, determines the follow-on use of the loss of potential detection. When the ELOP is set to YES, the relay sets the ILOP element after an LOP condition has been detected and the distance elements are actually blocked in the relay. The ILOP element will follow the state of LOP element. The LOP element will merely indicate that an LOP condition has been determined. The LOP signal thus can be used for testing or other purposes without disturbing the action of the protective elements. The ILOP signal will actually block the action of the protective elements, if ELOP is "YES". If, on the other hand, ELOP is set to NO, then the LOP element may be set by an LOP determination, but the distance and directional elements are not blocked.

As indicated above, with the circuit of FIG. 2, it is possible for a LOP determination to occur, but there is a delay of 60 cycles. This 60-cycle delay provides adequate time for the relay closest to an actual fault on the faulted line to detect the fault and trip the associated breaker.

As indicated above, the supervisory functions for the magnitude change of positive sequence voltage, involving the magnitude of the positive and zero sequence currents and their respective current angles, are contained in logic circuit 68. One comparison is between the positive sequence current and the positive sequence current from one cycle earlier. The magnitude of the positive sequence current from one cycle earlier is subtracted from the present magnitude of positive sequence current by subtract unit 96. This difference value is applied as one input to a comparator 98. The output of comparator 98 is high if the difference magnitude is greater than 0.1 of the secondary (transformer) current. The output of comparator 98 is applied at one input to OR gate 100.

The angle comparison is made by subtract unit 102. Subtract unit 102 subtracts the angle of the current of one cycle earlier from that of the present current angle for positive sequence current. The difference is then applied as one input to comparator 104, where it is compared against a value of 5°. If the difference angle is greater than 5°, then the output of 104 is high and applied to an AND gate 94.

The other input to AND gate 94 is from AND gate 92. The present positive sequence current and the positive sequence current of one cycle earlier are both compared against a value of 0.25 of the secondary current in amps. This is done by comparators 88 and 89, to provide a threshold test for angle comparisons. The outputs of comparators 88 and 89 are applied to AND gate 92, the output of which is applied as the other input to AND gate 94. The output of AND gate 94 is also applied as one input to OR gate 100.

Hence, the inputs to OR gate 100 from AND gate 94 and comparator 98 indicate that neither the positive sequence current nor the positive sequence current angle is changing sufficiently, as determined by the selected thresholds, to prevent a loss of potential determination. For the LOP status to be ultimately established, as described above, the positive sequence current and the positive sequence current angle must not be changing more than a threshold amount. If the change in either is greater than the thresholds, then there will be an output from OR gate 100, which will initiate timer 66, producing a high at the NOT input to AND gate 60.

The circuitry for the zero sequence current magnitude and zero sequence current angle comparison is quite similar as that for the above-described positive sequence comparisons. The present zero sequence current value and the zero sequence current value from one cycle previous is applied to a subtract unit 108. The output of subtract unit 108 is applied to a comparator 110. If the difference is greater than 0.1 secondary (transformer) current, indicating that the magnitude of the zero sequence current is changing significantly, then the output of comparator 110 is high. The output of comparator 110 is applied to OR gate 112. Again, a substantially non-changing zero sequence current magnitude, combined with a changing positive sequence voltage magnitude, could indicate a loss of potential condition.

Similarly, the angles of the two zero sequence current values are compared by subtract unit 114. The difference between the two current angles is applied to a comparator 116, which has a threshold value of 5°. If the difference is greater than 5°, then the output of comparator 116 is high, which is applied to AND gate 118.

The other input to AND gate 118 is from AND gate 120, which is responsive to two comparators, 122 and 124, which determine whether the zero sequence current measurements are greater than 0.08 secondary (transformer) current. If that is true, then the output of AND gate 1will be high, and the output of AND gate 118 will also be high if its other input is high. The output of OR gate 112 is applied to OR gate 100. If any of the inputs to OR gate 100 are high, indicating a higher than threshold change in the magnitude or angle of the positive sequence or zero sequence current, then the output of OR gate 100 is high, which is applied to an instantaneous-pickup time-delay dropout timer 66.

The output of timer 66 is thus high when there is a greater than threshold change in magnitude and/or angle of either the positive sequence current or the zero sequence current, i.e. the four supervisory functions. The high output remains high for one cycle after the most recent indication of threshold clearing current (magnitude or angle) change. The one cycle dropout time ensures that the overall logic does not give an LOP indication for line breaker openings where the magnitude of the current may drop to zero very rapidly for light load conditions. The output of timer 66 is applied on line 64 to a NOT input of AND gate 60. When the signal on line 64 goes high, the NOT input goes low AND gate 60 is effectively disabled.

The reset portion of the circuit for flip-flop 72 is shown generally at 130. The purpose of the reset portion is to reset the LOP and ILOP logic indications once valid three-phase voltages are restored to the relay. Basically, a valid three-phase voltage condition is defined as that where the magnitude of the positive sequence voltage is greater than 50 volts secondary (voltage transformer), where the zero sequence voltage is less than 5 volts secondary, and where the magnitude of the positive sequence voltage is not decreasing (as determined by a preselected threshold). The logic requires that such a balanced condition be present for at least one cycle.

Comparator 132 compares the present positive sequence voltage against a threshold standard of 50 volts. This value is secure, in that it is above the positive sequence voltage magnitude which is available when there is one blown fuse and the power system is running 10% above nominal. The output of comparator 132 is applied to one input of AND gate 134. The output of comparator 52 is also applied on line 136 to a NOT input of AND gate 134. Hence, if there is an indication that the positive sequence voltage is changing, which is the starting point for the LOP determination, then reset of the circuit is prevented through the AND gate 134 path.

The other input to AND gate 134 is from comparator 138. Comparator 138 makes a determination that the present zero sequence voltage is less than 5 volts secondary (voltage transformer). If that is the case, the NOT input to AND gate 134 will be high and the output of AND gate 134 will go low, which is applied to a one-cycle time-delay pickup/instantaneous dropout timer 140. The output of AND gate 134 will be high only when the 50-volt threshold has been reached for the positive sequence voltage, when the positive sequence voltage is not changing substantially, and when the zero sequence voltage is less than 5 volts. There is a one-cycle delay, however, before there is an output from timer 140.

The output of timer 140 is applied to an OR gate 143. The other input to OR gate 143 is from AND gate 144. The inputs to AND gate 144 are a "three-pole open" signal and the status of the loss of potential condition relative to the previous cycle. As indicated above, the reset signal, which is a low, has priority such that if a signal appears simultaneously at the "S" and "R" inputs of flip-flop 72, the flip-flop will go to the reset position, and its output will go low. The low output from flip-flop 72 will reset the LOP elements, removing the LOP determination.

The present circuit has been tested under a variety of unusual system conditions and has operated successfully. These include operation with a three-phase fault; i.e. with zero volts on all three phases. In such a case, the $V_1$ "check" is disabled and the ILOP cannot set. With respect to the circuit breaker possibly opening under load interruption (non-fault) conditions, magnitude and angle current checks will block the ILOP action. If there is a false ILOP, it is squelched by the 3PO signal, thereby preventing a latch of the ILOP for no-load interruption breaker conditions.

In the case of the circuit breaker opening under fault conditions, the present circuit will not give a false ILOP, as the fault conditions will produce change in the currents, which will then prevent an LOP condition.

Hence, the embodiment shown is representative of applicant's invention, which is defined by the claims, directed toward a loss-of-potential (LOP) circuit which is both secure and fast, and which overcomes many of the disadvantages of prior LOP circuits.

Although a preferred embodiment of the invention has been disclosed herein for illustration, it should be understood that various changes, modifications and substitutions may be incorporated in such embodiment without departing from the spirit of the invention, which is defined by the claims which follow.

What is claimed is:

1. An apparatus in a protective relay which is responsive to the three phase voltages on a power line for protecting power systems, the apparatus determining loss of potential of one or more of the three phase voltages, comprising:

means for determining a present value of positive sequence voltage on the power line at a present point in time and for determining an earlier value of positive sequence voltage for a selected earlier point in time and for comparing a change value representative of change in positive sequence voltage between the present value and the earlier value against a first preselected threshold value;

means for determining a present value of positive sequence current on the power line at said present point in time and for determining an earlier value of positive sequence current at said selected earlier point in time and for comparing a change value representative of change in positive sequence current between the present value and the earlier value against a second preselected threshold value; and means for producing an output signal indicative of a loss of potential condition on the power line when the change in positive sequence voltage exceeds the first threshold value, indicating that the positive sequence voltage is changing at a rate greater than a pre-established standard defined by the first threshold value between said present point in time and said earlier point in time and the change in positive sequence current is less than the second threshold value, indicating that the positive sequence current is not changing significantly between said present point in time and said earlier point in time.

2. An apparatus of claim 1, wherein said output signal is not latched for a selected period of time following initial indication of a loss-of-potential condition.

3. An apparatus of claim 2, wherein the selected period of time is approximately 60 cycles.

4. An apparatus of claim 1, including means for disabling the loss of potential determination if a three-pole open condition on the power line is recognized.

5. An apparatus of claim 1, wherein the third and fifth preselected values are approximately 5 degrees.

6. An apparatus of claim 1, including means for using said output signal to block circuit breaker trip operations of protective elements in the relay.

7. An apparatus of claim 5, including means for selectively enabling said blocking means.

8. An apparatus of claim 1, including means for resetting said apparatus such that the output signal indicating a loss-of-potential condition is no longer present, if the positive sequence voltage on the power line is greater than a first preselected voltage, and if the zero sequence voltage on the power line is less than a second preselected voltage.

9. an apparatus of claim 8, wherein the first and second preselected voltages are approximately 50 V and 5 V, respectively.

10. An apparatus of claim 1, including means for determining a present value of zero sequence current and for determining an earlier value of zero sequence current at said earlier point in time and for comparing a change value representative of change in zero sequence current between the present value and the earlier value against a third preselected threshold value and wherein the output signal is prevented if the third threshold value is exceeded.

11. An apparatus of claim 10, including means for determining the present angle of said positive sequence current on the power line and the angle of said positive sequence current for selected earlier time, comparing any difference therebetween against a fourth preselected value and means for determining the present angle of said zero sequence current and the angle of said zero sequence current for said selected earlier time, comparing any difference there between against a fifth preselected value, and for preventing said output signal if either the fourth or fifth preselected values are exceeded.

12. An apparatus of claim 1, including means for comparing the ratio of the present value of positive sequence voltage and the earlier value of positive sequence voltage against a preselected threshold value of 0.9.

13. An apparatus of claim 11, wherein the second and fourth preselected threshold values are approximately 0.1 secondary transformer current.

* * * * *

UNITED STATES PATENT AND TRADEMARK OFFICE
CERTIFICATE OF CORRECTION

PATENT NO. : 5,883,578
DATED : May 16, 1999
INVENTOR(S) : Jeffrey B. Roberts and Daqing Hou It is certified that error appears in the above-identified patent and that said Letters Patent are hereby corrected as shown below:

Title page,
Please correct the inventors name "Daging Hou" to

--Daqing Hou--.

Signed and Sealed this

Tenth Day of April, 2001

Attest:

NICHOLAS P. GODICI

Attesting Officer        Acting Director of the United States Patent and Trademark Office